(12) United States Patent
Yoo

(10) Patent No.: US 7,141,513 B2
(45) Date of Patent: Nov. 28, 2006

(54) INTEGRATED ASHING AND IMPLANT ANNEALING METHOD USING OZONE

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 119 days.

(21) Appl. No.: 10/970,040

(22) Filed: Oct. 21, 2004

(65) Prior Publication Data

US 2005/0085094 A1   Apr. 21, 2005

Related U.S. Application Data

(63) Continuation-in-part of application No. 10/690,315, filed on Oct. 20, 2003, now Pat. No. 6,897,162.

(51) Int. Cl.
   *H01L 21/31*   (2006.01)
   *H01L 21/469*  (2006.01)

(52) U.S. Cl. .............. 438/770; 257/E21.079; 257/E21.082; 430/329

(58) Field of Classification Search .......... 438/770; 257/E21.079, E21.082
   See application file for complete search history.

(56) References Cited

U.S. PATENT DOCUMENTS 4,936,772 A   6/1990   Zajac

| 5,466,325 A | * | 11/1995 | Mizuno et al. ............. 156/344 |
| 5,709,754 A | | 1/1998 | Morinville et al. |
| 5,714,011 A | * | 2/1998 | Schneider et al. ............. 134/21 |
| 6,300,239 B1 | * | 10/2001 | Ono ............................. 438/633 |

FOREIGN PATENT DOCUMENTS

| EP | 0910 188 A1 | 3/1998 |
| JP | 59-56730 | 4/1984 |
| JP | 62-245634 | 10/1987 |
| WO | WO 01/29879 A2 | 4/2001 |

* cited by examiner

*Primary Examiner*—Asok Kumar Sarkar
(74) *Attorney, Agent, or Firm*—MacPherson Kwok Chen & Heid LLP; Tom Chen

(57) ABSTRACT

After ion implantation, thermal ashing is performed using ozone at a pressure of between about 0.01 to about 1000 Torr at below 1000° C. to remove the resist. Since the process includes a substantial amount of ozone, the resist can be completely oxidized, thus leaving no residue or other contaminates to remain on the substrate. Using ozone allows fast resist removal with minimal residue at low temperatures.

34 Claims, 5 Drawing Sheets

INTEGRATED ASHING AND IMPLANT ANNEALING METHOD USING OZONE

CROSS REFERENCE TO RELATED APPLICATIONS

This application is a continuation-in-part of U.S. application Ser. No. 10/690,315, filed Oct. 20, 2003 now U.S. Pat. No. 6,897,162.

BACKGROUND

1. Field of Invention

This invention generally relates to semiconductor manufacturing methods and, more particularly, to a method for removing organic films and materials used during semiconductor wafer fabrication.

2. Related Art

New processing and manufacturing techniques are continuously being developed to make further advancements in the development of semiconductor devices, especially semiconductor devices of decreased dimensions.

An important aspect of the semiconductor device fabrication process is the removal of the photoresist film. As the size of semiconductor devices continues to decrease, typical photoresist removal methods must be able to increase the rate of residual-free resist removal, and must decrease the amount of damage caused in the substrate layers underlying the resist film.

Typically two types of ashing methods exist—a wet method and a dry method. The wet method is generally preferable to the dry method, since it does not damage the underlying substrate. However, in wet ashing methods the chemical bath that is needed to remove the resist can also contaminate the substrate. In addition, particles that remain in the chemical bath can re-adhere to the substrate. Thus, in the wet ashing method a cleaning step is required before the substrate is ready for the anneal process.

The dry ashing method typically includes exposing the substrate and the photo resist to a plasma. The plasma formation occurs at low pressure. Thus, the amount of reactive gas available to the removal process is low. For example, in an oxygen plasma that is formed at about 1 Torr, the amount of $O_2$ available to react with the photoresist is about 1000 times less than is available in air.

Unfortunately, substrate damage can occur as the substrate is exposed to the plasma due to the ion bombardment. In addition, dry ashing methods usually leave residue on the wafer surface even after the ashing processes are complete. As a result, the photoresist stripped wafer has to be reprocessed by wet cleaning before conducting an ion implant anneal or other process, which adds another level of complexity to the overall substrate processing.

What is needed, therefore, is an ashing method that reduces damage to the substrate, reduces the amount of residue and particle contaminates remaining on the stripped substrate and increases the throughput of the ashing process.

SUMMARY

The present invention provides a method for removing a resist from the surface of a substrate that reduces damage to the underlying substrate and reduces the amount of residue and particles remaining on the substrate after the resist removal process. The rate at which substrates are processed can be increased, since process steps typically associated with resist removal methods can be eliminated in the present invention.

In one example, after an ion implantation step, thermal ashing is conducted by introducing ozone ($O_3$) in the processing chamber. The introduction can be by supplying ozone into the chamber or by making ozone in the chamber through a reaction. The environment may be maintained, for example, at a pressure of between about 0.01 to about 1000 Torr at low temperatures, for example, up to between about 25° C. (or 700° C.) and 1300° C., to remove the resist quickly.

Since, for example, resist consists of Carbon (C), Hydrogen (H) and Oxygen (O), the products of reaction of the thermal oxidation of the resist include $CO_2$ and $H_2O$. The process of the present invention includes a substantial amount of $O_3$ to ensure that the resist is completely oxidized. The completeness of the oxidation is such that it leaves no residue or other contaminates to remain on the substrate.

Making the ozone in the chamber can be accomplished, in one embodiment, by introducing $O_2$ gas into the chamber, where the chamber contains ultraviolet (UV) lamps. UV light energy interacts with the $O_2$ to produce ozone or $O_3$. In such a process chamber, the UV lamps may be positioned above the wafer and heating elements may be positioned below the wafer. Having both light and thermal energy sources allows integrated photo (or light) and thermal curing of thin films. In one embodiment, internal curing of the film is first accomplished by photo-curing with light energy. Thermal heating can then cure or harden the outer surfaces. Advantages include complete curing of the film (both internally and externally) without cracking. In conventional methods, the outer surface is first thermally hardened, and then internal curing is performed, such as by outgassing (e.g., using $H_2O$ and volatile vapors). However, this internal curing can be difficult and cause cracking of the film.

In another example of the present invention, the thermal ashing process occurs after ion implantation and before metallization, thus, maintaining the processing temperature near 700° C. does not affect the substrate structure. Advantageously, conducting the thermal ashing at a temperature less than 700° C. does not affect redistribution or activation of the implanted species.

In yet another example of the invention, the thermal ashing process is conducted in a "one step" process. A substrate at ambient temperature is positioned in a processing chamber filled with $O_3$, which has been pre-heated to implant annealing temperatures (e.g., up to about 1300° C.). Advantageously, as the substrate heats from ambient to the annealing temperature, the thermal ashing process commences. However, the thermal ashing process is complete before the substrate temperature reaches a steady-state temperature equivalent to the annealing temperature. Once the substrate reaches the annealing temperature, the implanted species is electrically activated.

In another example, the same thermal ashing process can be used after a metallization process at temperatures below the critical melting temperatures of the metals. For example, exposing a substrate and resist to 10% $O_3$ at 100° C. at 760 Torr can remove a typical resist layer in about 10 minutes. However, the temperatures are low enough that the metal is not affected. Using thermal ashing after metallization while not using a plasma eliminates adverse affects caused because of the interaction of the metal and the plasma. Advantageously, since the cation and the electron typically included in a plasma ashing process are not employed, the wafer surface and other layers are not damaged.

In one aspect, an ashing method is provided including providing a substrate having a resist layer and implanted elements, and placing the substrate into a first processing chamber. The method also includes introducing $O_3$ into or making $O_3$ in the first processing chamber at a first partial pressure above 0.01 Torr; and varying the temperature of an internal environment of the first processing chamber to cause the oxygen to oxidize the resist layer to remove the resist layer from the substrate.

In another aspect, an ashing method is provided including introducing $O_3$ into or making $O_3$ in an internal environment of a first processing chamber to a first partial pressure; maintaining the internal environment of the first processing chamber at a first annealing temperature; and introducing a substrate having a first temperature and a resist layer formed thereon into the internal environment of the first processing chamber allowing the resist to be oxidized as the substrate heats from the first temperature to the annealing temperature.

In yet another aspect, an ashing method is provided including providing a substrate having a resist layer formed thereon and placing the substrate into an internal environment of a first processing chamber; introducing $O_3$ into or making $O_3$ in the internal environment of the first processing chamber at a first partial pressure of between 0.01 Torr and 1000 Torr; increasing a first temperature of the internal environment of the first processing chamber to a second temperature causing the ozone to react with the resist layer to oxidize the resist layer; and increasing the second temperature to a third temperature.

Other embodiments include "pulling" exhaust gases from the processing chamber and heating the exhaust gases as the exhaust gases exit the chamber. This can be accomplished with a long exhaust tube coupled to an exhaust port of the chamber, where heaters arranged along the length of the tube. A second exhaust tube, which in one embodiment is perpendicular to the long exhaust tube, can be a venturi that pulls the exhaust gases from the processing chamber, through the long exhaust tube and second exhaust tube. A gas/compressor may be coupled to one end of the second exhaust tube to generate sufficient vacuum force for the venturi. Heating the exhaust gases as they leave the processing chamber prevents condensation from accumulating along the exhaust tube, which may result in clogging of the exhaust tube. A long exhaust tube allows heat to be distributed more evenly as the exhaust gases are purged.

One advantageous aspect of the thermal ashing of the present invention is that wet cleaning process steps usually carried out between the conventional stripping and ion implantation annealing can be reduced or eliminated. Using ozone allows the resist to be removed very quickly and with less by-products (e.g., cleaner) compared to conventional processes. For example, it may take approximately 5 to 10 minutes to remove photoresist using ozone depending on photoresist condition.

Since no plasma is created using the thermal ashing process of the present invention to remove the resist, ion damage to the substrate is eliminated.

These and other features and advantages of the present invention will be more readily apparent from the detailed description of the preferred embodiments set forth below taken in conjunction with the accompanying drawings.

DETAILED DESCRIPTION

Figure 1:
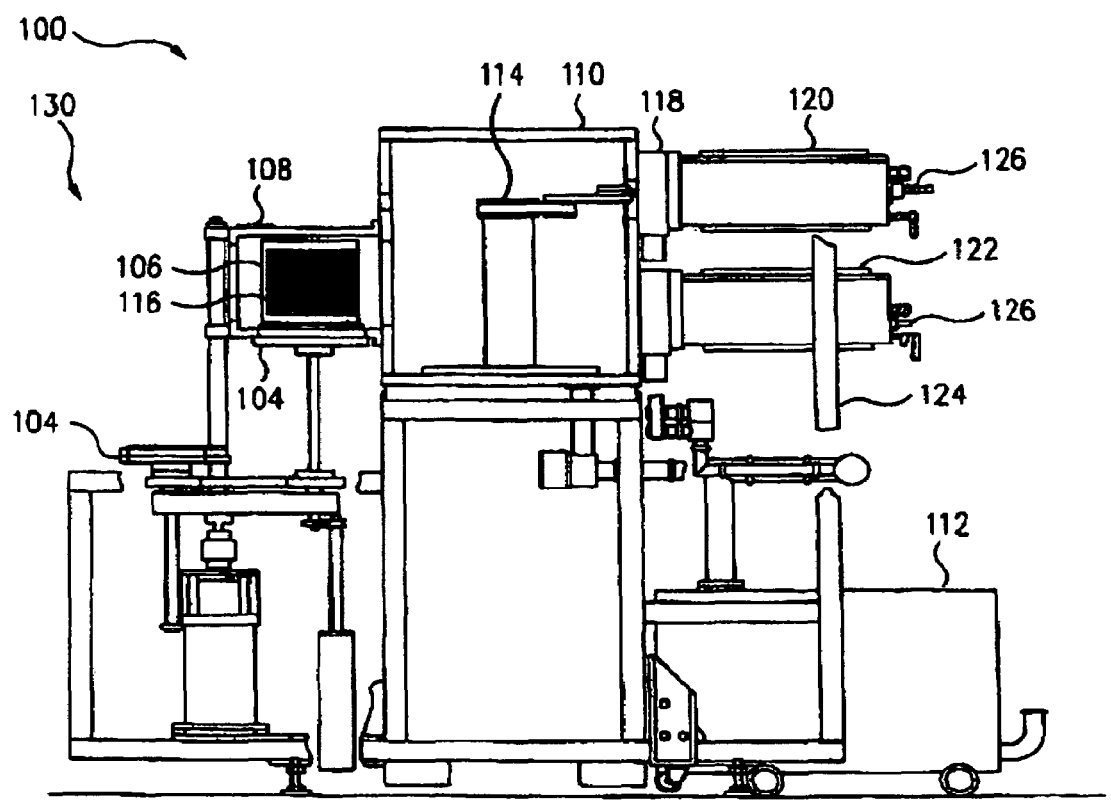
FIG. 1 is a schematic illustration of a side view of an embodiment of a semiconductor wafer processing system that establishes a representative environment of the present invention.

FIG. 1 is a schematic illustration of a side view of one embodiment of a semiconductor wafer processing system 100 that establishes a representative environment of the present invention. Processing system 100 includes a loading station 130 which has multiple platforms 104 for supporting and moving a wafer cassette 106 up and into a loadlock 108. Wafer cassette 106 may be a removable cassette which is loaded into a platform 104, either manually or with automated guided vehicles (AGV). Wafer cassette 106 may also be a fixed cassette, in which case wafers are loaded onto cassette 106 using conventional atmospheric robots or loaders (not shown). Once wafer cassette 106 is inside loadlock 108, loadlock 108 and transfer chamber 110 are maintained at atmospheric pressure or else are pumped down to vacuum pressure using a pump 112. A robot 114 within transfer chamber 110 rotates toward loadlock 108 and picks up a wafer 116 from cassette 106. A reactor or thermal processing chamber 120, which may also be at atmospheric pressure or under vacuum, accepts wafer 116 from robot 114 through a gate valve 118. Optionally, additional reactors may be added to the system, for example thermal processing chamber 122. Robot 114 then retracts and, subsequently, gate valve 118 closes to begin the processing of wafer 116. After wafer 116 is processed, gate valve 118 opens to allow robot 114 to remove and place wafer 116. Optionally, a cooling station (not shown) is provided, which allows the newly processed wafers, which may have temperatures upwards of 100° C., to cool before they are placed back into a wafer cassette in loadlock 108. A representative processing system is disclosed in U.S. Pat. No. 6,410,455, which is herein incorporated by reference for all purposes.

In accordance with the present invention, thermal processing chambers 120 and 122 can be single wafer rapid thermal furnace (SRTF) systems, such as those used in thermal anneals. In other embodiments, thermal processing chambers 120 and 122 can be other types of reactors, such as those used for dopant diffusion, thermal oxidation, nitridation, chemical vapor deposition, and similar processes.

Figure 2A:
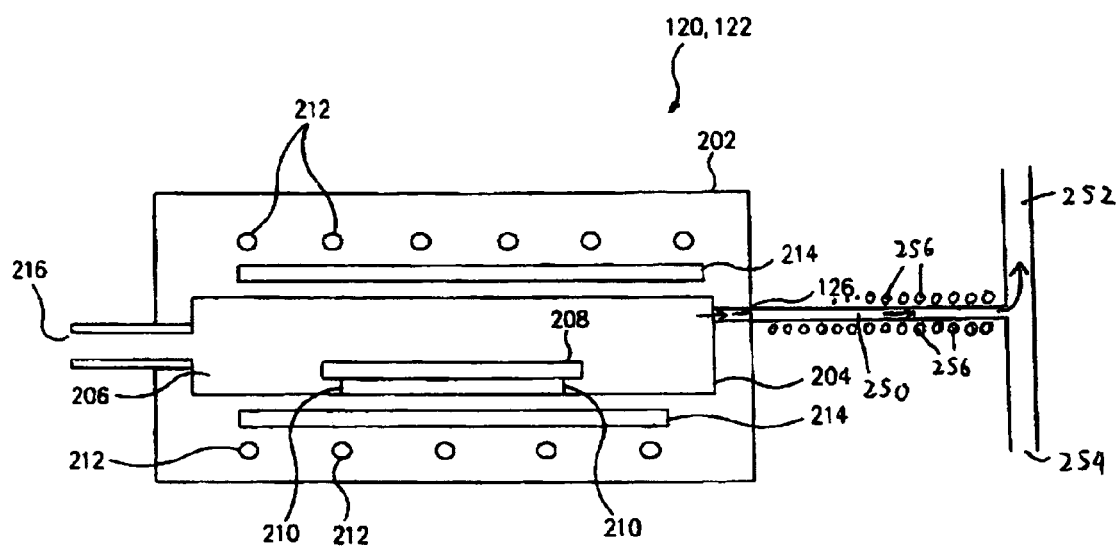
FIG. 2A is a simplified cross-sectional view of a thermal processing chamber in accordance with an embodiment of the present invention.

FIG. 2A is a simplified cross-sectional view of thermal processing chamber 120 (and 122) in accordance with an embodiment of the present invention. Externally, thermal processing chamber 120 may be a metallic shell 202 preferably made of aluminum or similar metal, defining an opening 204 configured to receive a wafer for processing.

Thermal processing chamber 120 includes a process tube 204, which defines an interior cavity 206 in which processing of wafer 208 can occur. In one embodiment, process tube 204 may be constructed with a substantially rectangular cross-section, having a minimal internal volume surrounding wafer 208. Process tube 204 can be made of quartz, but may be made of silicon carbide, $Al_2O_3$, or other suitable material. Process tube 204 can be capable of being pressurized with pressures between about 0.001 Torr to 1000 Torr, for example, between about 0.1 Torr and about 760 Torr.

Positioned within cavity 206 of process tube 204 are wafer support standoffs 210, which support the single wafer 208. Standoffs 210 may be any high temperature resistant material, such as quartz. In some embodiments, standoffs 210 may have a height of between about 50 μm and about 20 mm.

Process tube 204 includes an exhaust port 126 for expelling gases. Exhaust port 126 is coupled to a long exhaust tube 250, which in one embodiment is between 10 cm and 200 cm in length. A second exhaust tube 252, such as a venturi, is coupled to the other end of exhaust tube 250 along an interior portion of exhaust tube 252. A gas/compressor (not shown) may be coupled to an end 254 of exhaust tube 252, which generates sufficient vacuum force for the venturi to draw exhaust gases from cavity 206, through exhaust tubes 250 and 252 (as shown by the arrows).

In one embodiment, heating elements 256 are positioned along the length of exhaust tube 250 to heat the exhaust gases as they exit cavity 206, an advantage of which will be discussed below. Exhaust gases may include by-products, unused ozone, and any other gases.

Process tube 204 is substantially surrounded by chamber heating elements 212. Heat diffusing members 214 can be positioned proximate to heating elements 212 so as to be between heating elements 212 and process tube 204. Heat diffusing members 214 absorb the thermal energy output from heating elements 212 and dissipate the heat evenly across process tube 204. Heat diffusing members 214 may be any suitable heat diffusing material that has a sufficiently high thermal conductivity, preferably silicon carbide, $Al_2O_3$, or graphite.

Opening 216 provides access for the loading and unloading of wafer 208 before and after processing and for providing oxygen containing processing gases, if needed. Opening 216 may be a relatively small opening. In one embodiment, opening 216 may have a height and width large enough to accommodate a wafer of between about 0.5 to 2 mm thick and up to about 300 mm (~12 in.) in diameter, and a portion of robot 106 (FIG. 1) passing therethrough. The height of opening 216 can be between about 18 mm and 50 mm, for example, no greater than about 20 mm. It should be understood that the size of process tube 204 and opening 216 can be made any size large enough to accommodate the processing of any sized wafer.

Showerheads (not shown) may also be located between heating elements 212 and wafer 208 to disperse gas, such as ozone, over and across wafer 208 positioned on standoffs 210. Conventional showerheads may be used, such as one or more showerheads, each with numerous holes that inject a uniform flow of gas onto the wafer surface. The showerheads may be any suitable shape, such as triangular, with single or multiple zones to provide desired (e.g., equal) exposure to all areas of wafer 208.

Figure 2B:
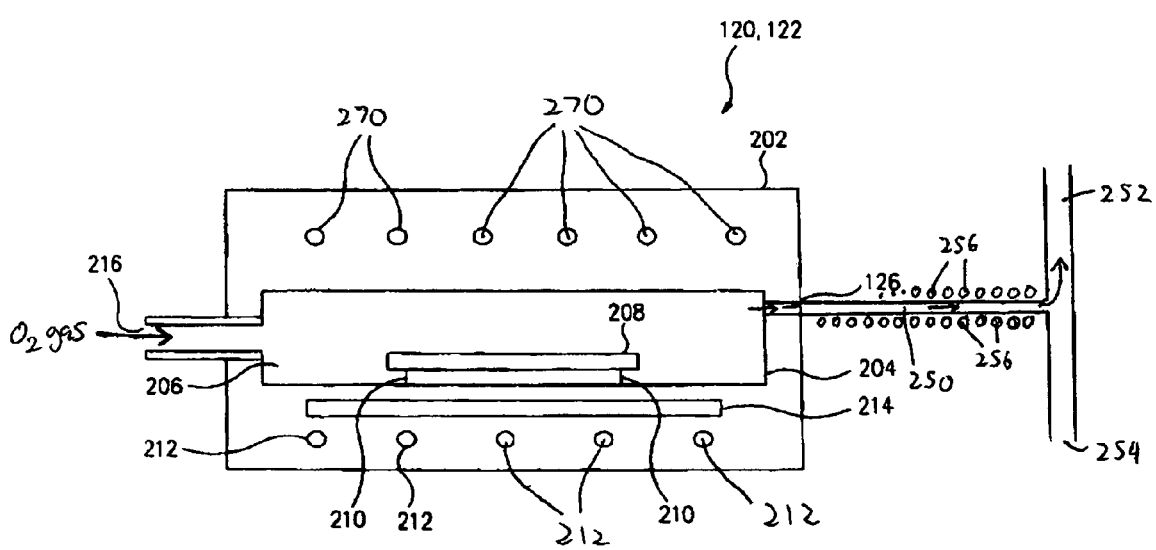
FIG. 2B is a simplified cross-sectional view of a thermal processing chamber in according with another embodiment.

FIG. 2B shows a thermal processing chamber according to another embodiment, in which ozone is produced within the chamber rather than introduced or supplied from an outside source. The processing chamber in this embodiment is similar to the one shown in FIG. 2A, except that the upper heat diffusing member 214 and the upper heating elements 212 are replaced with a light source 270, such as UV lamps. Process tube 204 has chamber heating elements 212 and heat diffusing members 214 located at the lower portion of the chamber, i.e., beneath the wafer 208. Located at the upper portion of the chamber, i.e., above the wafer 208, is the light source 270. Ozone can be generated within chamber 206 by introducing oxygen ($O_2$) containing processing gas into the chamber via opening 216. Light energy from light source 270 irradiates the $O_2$-containing gas to generate ozone or $O_3$. Processing with $O_3$ can then continue, such as described above with respect to FIG. 2A.

The processing chamber of FIG. 2B can also be used to cure thin films during semiconductor manufacturing using a combination of both light (or photon) energy and thermal (or heat) energy. Light energy is supplied from light source 270, while thermal energy is supplied through heating elements 212. In one embodiment, the wavelength of light energy is between approximately 150 nm and 10 microns (e.g., UV light, visible light, and infrared light). The light can be broadband or single wavelength.

Figure 3A:
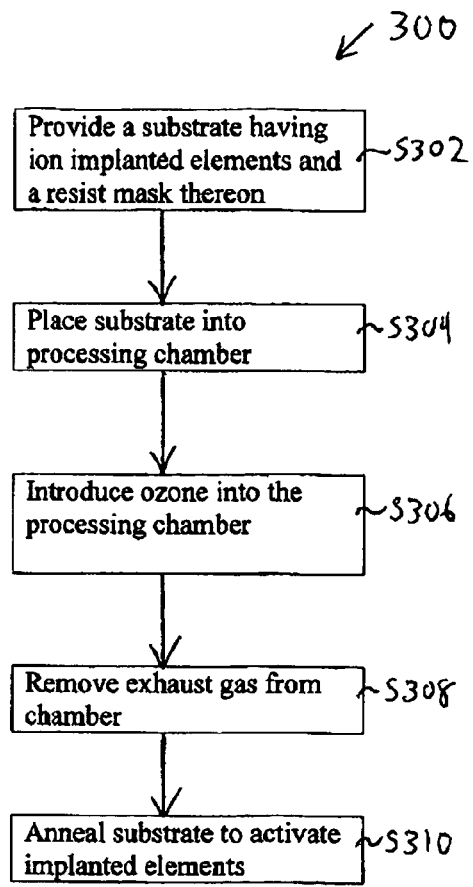
FIG. 3A is a flowchart of an embodiment of the process of the present invention for the chamber of FIG. 2A.

FIG. 3A is a flowchart of an exemplary thermal ashing process (300) of the present invention using the processing chamber of FIG. 2A.

In one embodiment, a silicon substrate or wafer is provided. In this embodiment, the wafer has undergone an ion implant process (s302). For example, a substrate having an N well and a P well formed thereon. The p-type impurity and n-type impurity are separately implanted while covering respective parts of the silicon substrate with the resist mask. While forming MOS transistors in the N well and the P well respectively, the p-type impurity and the n-type impurity are ion-implanted selectively into the N well and the P well. A resist mask is used to cover one of the N well and the P well, since different impurities are to be implanted into the N wells and the P wells, respectively. For example, n-type impurities may include phosphorus and arsenic, while p-type impurities may include boron.

Before being able to continue with the ion-implantation process, the resist is removed.

In one embodiment of the present invention, the resist removal process begins by loading wafer 208 into processing chamber 120 through the load/unload chamber 108 to be placed on wafer standoffs 210 (s304). Immediately after this placement, gate valve 118 is closed. If resist formation is performed in processing chamber 120, wafer 208 remains in processing chamber 120.

A reaction gas of up to substantially 50% pure ozone ($O_3$) is introduced into processing chamber 120 after the placement of wafer 208 in processing chamber 120 (s306), such as by showerheads, gas inlet ports, or any other suitable ozone delivery method or element. The partial pressure of the ozone in processing chamber 120 is adjusted, for example, to between about 0.01 Torr and 1000 Torr.

The temperature of the internal environment of processing chamber 120 is ramped up from ambient or, alternatively, from a pre-heated temperature to up to about 25° C. (or 700° C.) to about 1300° C., e.g., 1000° C.

Under these temperature and pressure conditions, $O_3$ reacts with the resist layer. Since the resist layer is made of carbon, hydrogen and oxygen, the oxidation of the resist layer yields $CO_2$ and $H_2O$. The high concentration of $O_3$ at the elevated temperatures ensures that the oxidation of the resist is complete, thus leaving no residual to remain on wafer 208. If necessary or desired, the remaining $O_3$, $CO_2$ and $H_2O$ are subsequently exhausted away (s308). In some embodiments, processing chamber 120 may be purged using, for example, a heated exhaust tube and venturi to remove gases before commencing with annealing.

Gases remaining in processing chamber 120 need to be removed prior to annealing. However, in conventional gas purging systems, such as ones using a pump to remove the gases, condensation may occur at cold spots along the exhaust tube. The condensation may lead to clogging within the exhaust tube, resulting in less efficient purging of the gas. By heating the exhaust tube according to one embodiment, cold spots are minimized or eliminated, thereby leading to less clogging and more efficient gas exhaustion from processing chamber 120.

In one example, with wafer 208 having resist held in processing chamber 120 at about 100° C. in a substantially 10% ozone environment, the removal rate of photoresist can be made to be about 0.01 µm/min to about 0.1 µm/min.

Once the ashing process is complete, the temperature in processing chamber 122 is raised to an annealing temperature between, for example 25° C. and 1300° C. to activate the implanted species (s310). In one embodiment, the transition from the thermal ashing range of temperatures to the annealing temperature may be continuous.

Alternatively, wafer 208 can be removed from processing chamber 120 and placed in an annealing chamber, such as processing chamber 122 (FIG. 1). The temperature in processing chamber 122 is raised to an annealing temperature between, for example 25° C. and 1300° C. to activate the implanted species (s310). Advantageously, using two chambers to separately conduct the thermal ashing and annealing may increase the wafer throughput.

Figure 3B:
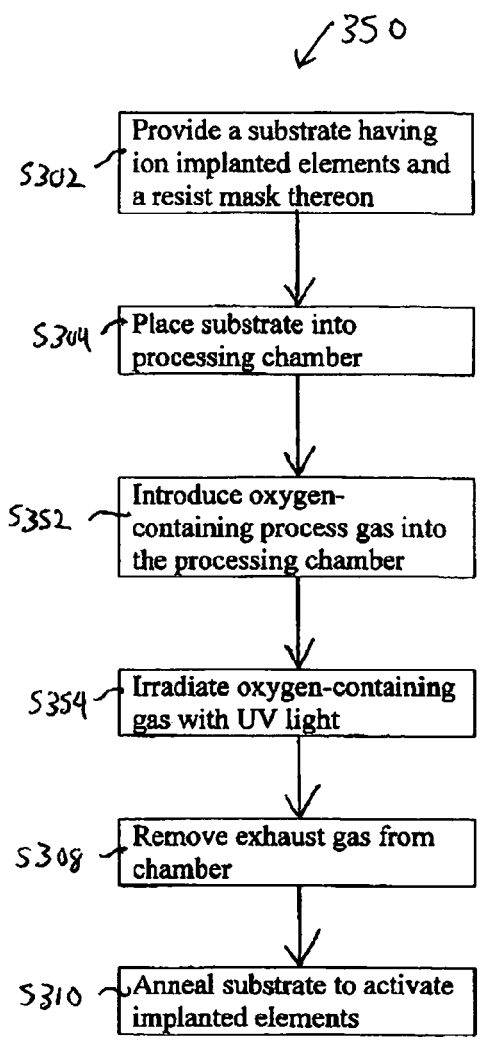
FIG. 3B is a flowchart of another embodiment of a process of the present invention for the chamber of FIG. 2B.

FIG. 3B is a flowchart of an exemplary thermal ashing process (350) of the present invention using the processing chamber of FIG. 2B. Steps s302 and s304 are the same as with the previous embodiment. Oxygen-containing process gases are introduced into the chamber (s352), followed by applying light energy, such as UV light, to generate ozone in the chamber (s354). Processing may then continue in steps s308 and s310, as discussed above.

Figure 4:
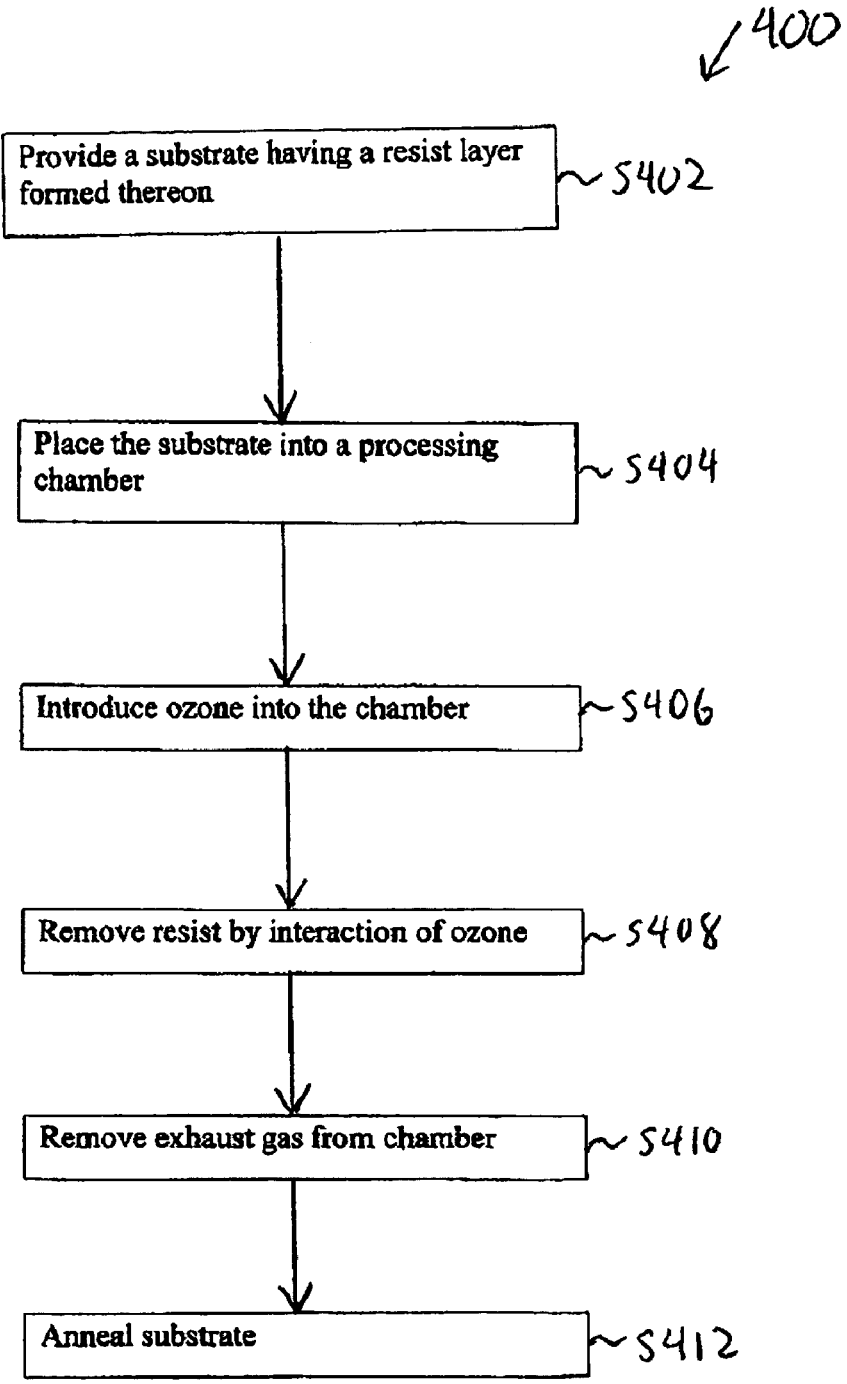
FIG. 4 is a flow chart illustrating yet another embodiment of the present invention.

FIG. 4 is a flow chart illustrating another embodiment of the present invention. In this embodiment, thermal ashing process 400 of the present invention can be accomplished using a single processing chamber 120 in a so-called "one step" process. In this embodiment, wafer 208 having a resist formed thereon is loaded in to processing chamber 120 (s402). The temperature of wafer 208 is at an ambient temperature (or at a temperature well below the present temperature of the processing chamber). The temperature of the internal environment of processing chamber 120 is maintained at a given processing temperature suitable for annealing, such as between about 900° C. and about 1300° C.

The reaction gas of substantially pure ozone ($O_3$) is introduced (s406) into processing chamber 120, such as by showerheads 260, thus exposing wafer 208 and the resist to the ozone and initiating the oxidation of the resist.

As wafer 208 heats from its ambient temperature to the annealing temperature of the processing chamber environment, the resist is oxidized, forming $CO_2$ and $H_2O$ (s408). The resulting by-products of the reaction, $CO_2$ and $H_2O$, as well as any remaining $O_3$, can then be removed, if desired, from processing chamber 120 (s410), such as by a heated exhaust tube and venturi.

As wafer 208 continues to heat towards a steady-state annealing temperature, the resist stripped wafer undergoes an implant anneal to activate the implanted impurities (s412).

The thermal ashing process of the present invention removes the resist without using a plasma and at temperatures below the critical temperature at which aluminum structures are compromised. Thus, the thermal ashing process of the present invention can be used to remove resist even in the presence of Al or other similar types of metals.

The thermal ashing process of the present invention has been described above as typically preceding an implant anneal. However, it should be understood by those of ordinary skill in the art that the thermal ashing process of the present invention, can be used to remove a resist layer prior to or proceeding most semiconductor manufacturing processes, such as diffusion, oxidation and deposition processes.

Having thus described embodiments of the present invention, persons skilled in the art will recognize that changes may be made in form and detail without departing from the scope of the invention. For example, the ashing and implant anneal process of the present invention can be accomplished in a batch wafer processing system to increase the throughput of wafers. Thus the invention is limited only by the following claims.

What is claimed is:

1. An ashing method comprising:
   providing a substrate having a resist layer and implanted elements, and placing said substrate into a first processing chamber;
   providing ozone ($O_3$) to said first processing chamber at a partial pressure above 0.01 Torr; and
   varying the temperature of the entire said first processing chamber to cause said ozone to oxidize said resist layer to remove said resist layer from said substrate.

2. The method of claim 1 wherein providing ozone into said first processing chamber at said first partial pressure comprises introducing ozone at an approximate percentage of 50% of ozone into said first processing chamber at a partial pressure of 760 Torr.

3. The method of claim 1, wherein varying the temperature of said internal environment of said first processing chamber comprises increasing the temperature of said internal environment to a temperature up to between about 25° C. and 1300° C.

4. The method of claim 1, wherein providing ozone into said first processing chamber as said partial pressure comprises introducing said ozone at a partial pressure of about 760 Torr; and wherein varying the temperature of said internal environment of said first processing chamber comprises increasing the temperature of said internal environment to a temperature up to about 1000° C.

5. The method of claim 4, wherein varying the temperature of said internal environment of said first processing chamber comprises increasing the temperature of said internal environment from a temperature of up to about 25° C. to a temperature up to about 1300° C.

6. The method of claim 1, further comprising annealing said substrate in a second processing chamber to activate said implanted elements.

7. The method of claim 6, wherein said first processing chamber and said second processing chamber are the same chamber.

8. The method of claim 1, wherein said oxidation of said resist layer to remove said resist layer from said substrate yields $CO_2$ and $H_2O$.

9. The method of claim 1, further comprising heating exhaust gases as the exhaust gases exit from the first processing chamber.

10. The method of claim 1, further comprising drawing exhaust gases out from the first processing chamber after the resist layer is removed.

11. The method of claim 10, wherein the drawing is performed with a venturi.

12. The method of claim 1, wherein providing the ozone comprises introducing an oxygen-containing gas into the first processing chamber and irradiating the oxygen-containing gas with light energy to generate ozone.

13. The method of claim 12, wherein the light energy is ultraviolet light.

14. The method of claim 1, further comprising:
providing a film over said substrate; and
curing said film by applying both thermal energy and light energy.

15. An ashing method comprising:
providing ozone ($O_3$) in an internal environment of a processing chamber to a partial pressure;
maintaining said internal environment of said processing chamber at an annealing temperature: and
introducing a substrate having a first temperature and a resist layer formed thereon into said internal environment of said processing chamber, allowing the temperature of said substrate at said first temperature to rise to the annealing temperature allowing said resist to be oxidized as said substrate heats from said first temperature to said annealing temperature.

16. The method of claim 15, wherein said partial pressure is between about 0.01 Torr and 1000 Torr.

17. The method of claim 15, wherein said first temperature is an ambient temperature.

18. The method of claim 15, further comprising allowing said substrate to heat to said annealing temperature causing said substrate to be annealed.

19. The method of claim 15, wherein said annealing temperature ranges from between about 25° C. and 1300° C.

20. The method of claim 15, further comprising heating exhaust gases as the exhaust gases exit from the processing chamber.

21. The method of claim 15, further comprising drawing exhaust gases out from the processing chamber after the resist layer is removed.

22. The method of claim 21, wherein the drawing is performed with a venturi.

23. The method of claim 15, wherein said introducing said substrate comprises introducing a plurality of substrates having said temperature and a resist layer formed thereon into said internal environment of said processing chamber.

24. The method of claim 15, wherein providing the ozone comprises introducing an oxygen-containing gas into the processing chamber and irradiating the oxygen-containing gas with light energy to generate ozone.

25. The method of claim 15, further comprising providing a film over said substrate, and curing said film by applying both thermal energy and light energy.

26. An ashing method comprising:
providing a substrate having a resist layer formed thereon and placing said substrate into an internal environment of a processing chamber;
providing ozone ($O_3$) into said internal environment of said processing chamber at a first partial pressure of between 10 Torr and 1000 Torr;
increasing a first temperature of said entire processing chamber to a second temperature causing said ozone to react with said resist layer to oxidize said resist layer; and
increasing said second temperature to a third temperature.

27. The method of claim 26, wherein said third temperature is greater than said second temperature.

28. The method of claim 26, wherein said increasing said first temperature to a second and said increasing said second temperature to said third temperature comprises a gradually continuous process.

29. The method of claim 26, further comprising heating exhaust gases as the exhaust gases exit from the processing chamber.

30. The method of claim 26, further comprising drawing exhaust gases out from use processing chamber after the resist layer is removed.

31. The method of claim 26, wherein the drawing is performed with a venturi.

32. The method of claim 26, wherein providing the ozone comprises introducing an oxygen-containing gas into the processing chamber and irradiating the oxygen-containing gas with light energy to generate ozone.

33. The method of claim 26, further comprising providing a film over said substrate, and curing said film by applying both thermal energy and light energy.

34. An ashing method comprising:
providing a substrate having a resist layer and implanted elements, and placing said substrate into a first processing chamber;
providing ozone ($O_3$) to said first processing chamber at a partial pressure above 0.01 Torr; and
varying the temperature of the entire said first processing chamber to cause said ozone to oxidize said resist layer to remove at least a bulk of said resist layer from said substrate.

* * * * *